US012802942B2

(12) United States Patent
Wang et al.

(10) Patent No.: US 12,802,942 B2
(45) Date of Patent: Nov. 17, 2026

(54) STRUCTURE AND METHOD FOR SOLVING PARASITIC PLASMA IN PLASMA PROCESSING APPARATUS

(71) Applicants: SUZHOU MAXWELL TECHNOLOGIES CO., LTD., Jiangsu (CN); SUZHOU MAIZHENG TECHNOLOGY CO., LTD., Jiangsu (CN)

(72) Inventors: Dengzhi Wang, Suzhou (CN); Fengming Wang, Suzhou (CN); Chen Chen, Suzhou (CN); Qingyuan Qu, Suzhou (CN); Xueyong He, Suzhou (CN); Wangjun Li, Suzhou (CN)

(73) Assignees: SUZHOU MAXWELL TECHNOLOGIES CO., LTD., Suzhou (CN); SUZHOU MAIZHENG TECHNOLOGY CO., LTD., Suzhou (CN)

( * ) Notice: Subject to any disclaimer, the term of this patent is extended or adjusted under 35 U.S.C. 154(b) by 395 days.

(21) Appl. No.: 18/579,834

(22) PCT Filed: Apr. 21, 2022

(86) PCT No.: PCT/CN2022/088108
§ 371 (c)(1),
(2) Date: Jan. 16, 2024

(87) PCT Pub. No.: WO2023/168801
PCT Pub. Date: Sep. 14, 2023

(65) Prior Publication Data

US 2024/0321554 A1 Sep. 26, 2024

(30) Foreign Application Priority Data

Mar. 7, 2022 (CN) ........................ 202210224150.5

(51) Int. Cl.
*H01J 37/32* (2006.01)
*C23C 16/44* (2006.01)
*C23C 16/455* (2006.01)

(52) U.S. Cl.
CPC .... *H01J 37/32449* (2013.01); *C23C 16/4405* (2013.01); *C23C 16/455* (2013.01);
(Continued)

(58) Field of Classification Search
CPC .............. C23C 16/4405; C23C 16/455; C23C 16/45561; C23C 16/509; H01J 37/32357;
(Continued)

(56) References Cited

U.S. PATENT DOCUMENTS 6,432,255 B1 * 8/2002 Sun ..................... H10P 72/0418 118/723 MP
2002/0011210 A1 * 1/2002 Satoh ................. C23C 16/4405 118/723 R
(Continued)

FOREIGN PATENT DOCUMENTS

CN 102067279 A 5/2011
CN 102094186 A 6/2011
(Continued)

OTHER PUBLICATIONS

International Search Report for International Patent Application No. PCT/CN2022/088108 (4 pages).
(Continued)

*Primary Examiner* — Benjamin Kendall
(74) *Attorney, Agent, or Firm* — GREENBLUM & BERNSTEIN, P.L.C.

(57) ABSTRACT

A structure and a method for solving parasitic plasma in a plasma processing apparatus are provided. In the structure, a first gas channel is in communication with a narrow-bore insulating tube and a second gas channel. The narrow-bore
(Continued)

insulating tube is configured to feed a process gas into a gas distribution assembly. An on-off valve is disposed between the second gas channel and the first gas channel. The second gas channel is configured to feed a cleaning gas into the gas distribution assembly. Therefore, on the one hand, the on-off valve can be closed before the processing, and a cleaning gas with a preset pressure can be fed into the wide-bore insulating tube and the second gas channel, thereby forming a relatively high-pressure environment in the wide-bore insulating tube and the second gas channel. On the other hand, the gas paths of the process gas and the cleaning gas are separate from each other, so that the path of the process gas can have a relatively small inner diameter, thereby preventing electrolysis of the process gas and generation of parasitic plasma before the process gas entering into the processing chamber, which effectively reduces the probability of rupture or damage of the insulating tube caused by the parasitic plasma.

10 Claims, 1 Drawing Sheet

(52) U.S. Cl.
CPC .. *C23C 16/45561* (2013.01); *H01J 37/32357* (2013.01); *H01J 37/3244* (2013.01); *H01J 37/32862* (2013.01)

(58) Field of Classification Search
CPC ............. H01J 37/3244; H01J 37/32449; H01J 37/32862; Y02P 70/50
See application file for complete search history.

(56) References Cited

U.S. PATENT DOCUMENTS

| | | | | |
|---|---|---|---|---|
| 2006/0137610 | A1* | 6/2006 | Yoshizaki | C23C 16/325 156/345.33 |
| 2006/0266288 | A1* | 11/2006 | Choi | H01J 37/3244 134/1.1 |
| 2007/0264443 | A1 | 11/2007 | Choi et al. | |
| 2011/0126764 | A1* | 6/2011 | Sun | C23C 16/4405 118/723 R |
| 2014/0123897 | A1 | 5/2014 | Tabata et al. | |
| 2021/0071296 | A1* | 3/2021 | Watarai | C23C 16/4405 |

FOREIGN PATENT DOCUMENTS

| | | | | |
|---|---|---|---|---|
| CN | 104962880 | A | 10/2015 | |
| CN | 105940482 | A | 9/2016 | |
| CN | 109563617 | A | 4/2019 | |
| CN | 109868458 | A | 6/2019 | |
| CN | 111739971 | A | 10/2020 | |
| JP | 2021-197489 | A | 12/2021 | |
| KR | 10-2020-0000705 | A | 6/2018 | |
| TW | 201120237 | A | 6/2011 | |
| WO | WO-2006121117 | A1 * | 11/2006 | C23C 16/4405 |

OTHER PUBLICATIONS

Written Opinion for International Patent Application No. PCT/CN2022/088108 (8 pages).

Extended European Search Report issued in European Patent Appl. No. 22930430.8 dated Jul. 5, 2025.

* cited by examiner

STRUCTURE AND METHOD FOR SOLVING PARASITIC PLASMA IN PLASMA PROCESSING APPARATUS

CROSS-REFERENCE TO RELATED APPLICATIONS

This application is an U.S. national phase application under 35 U.S.C. § 371 based upon international patent application No. PCT/CN/2022/088108 filed on Apr. 21, 2022, which itself claims priority to Chinese patent application No. 202210224150.5, filed on Mar. 7, 2022. The contents of the above identified applications are hereby incorporated herein in their entireties by reference.

TECHNICAL FIELD

The present disclosure relates to the technical field of a plasma processing apparatus, and specifically to a structure and a method for solving parasitic plasma in a plasma processing apparatus.

BACKGROUND

A plasma processing apparatus, such as plasma enhanced chemical vapor deposition (PECVD), is commonly used to deposit films on semiconductor wafers, flat substrates, solar cells, and liquid crystal display substrates. The deposition can be achieved by introducing process gases containing elements of a target film into a vacuum chamber including a substrate support. The process gas is flowed through a gas distribution assembly located near the top of the vacuum chamber. A radio-frequency (RF) power source coupled to the vacuum chamber provides RF power to the vacuum chamber, and excites the process gas into plasma. The excited gas is attached to the substrate surface to react and form a film or layer, and the substrate is maintained at a specific temperature by a heating device. The gas distribution assembly, which is typically connected to the RF power source or a very high frequency (VHF) power source, is used as the cathode in parallel plates for discharge, and the substrate is typically grounded.

In film deposition using the PECVD process, the deposited films are usually required to have high uniformity in both thickness and refractive index. As the demand for large-sized LCD panels and high-yield solar cells continues to grow, the size of the PECVD chambers for film deposition continues to increase, so does the power supplied. Moreover, the adoption of new process conditions with higher power and frequency has been demonstrated to improve apparatus performance as well.

However, the process gas and cleaning gas used in the current PECVD are usually fed through one common ceramic tube, and in order to ensure that the cleaning gas can be sufficiently and stably fed, the diameter of the ceramic tube is increased. As a result, a high-voltage current at a high power level can easily cause breakdown of the process gas in the ceramic tube, leading to early electrolysis of the process gas and generation of parasitic plasma in the ceramic tube, which not only increases power consumption, but also pollutes the ceramic tube by the accumulated films formed by the plasma reaction, and even induces the risk of rupture or damage of the ceramic tube.

SUMMARY

1. The Technical Problem to be Solved

The purpose of the present disclosure is to overcome the shortcomings of the plasma processing apparatus for vacuum deposition in prior art, which includes high RF power consumption and easy generation of parasitic plasma in the insulating tube, leading to rupture or damage of the insulating tube, and to provide a structure and a method for solving parasitic plasma in the plasma processing apparatus, with the aim of preventing generation of parasitic plasma in the insulating tube.

2. Technical Solution

In order to achieve the above purpose, the following technical solutions are provided in the present disclosure.

A structure for solving parasitic plasma in a plasma processing apparatus is provided in the present disclosure. The structure includes a first gas channel in communication with a gas distribution assembly, and a radio-frequency power source electronically connected to the first gas channel. The first gas channel is in communication with a narrow-bore insulating tube and a second gas channel. The narrow-bore insulating tube is configured to feed a process gas for plasma processing into the gas distribution assembly. An on-off valve is disposed between the first gas channel and the second gas channel. The second gas channel is configured to feed a cleaning gas into the gas distribution assembly.

Further, one end of the second gas channel is in communication with the first gas channel through the on-off valve, another end of the second gas channel is in communication with a remote plasma source through a wide-bore insulating tube, and the inner diameter of the wide-bore insulating tube is larger than the inner diameter of the narrow-bore insulating tube.

Further, the inner diameter of the narrow-bore insulating tube is in a range from 2 mm to 30 mm; and the inner diameter of the wide-bore insulating tube is in a range from 10 mm to 100 mm.

Further, the remote plasma source is in communication with a cleaning gas source through a third gas channel. The third gas channel is provided with a vacuum gauge. The vacuum gauge is configured to measure the pressure of the cleaning gas in the third gas channel.

Further, the third gas channel is in communication with a fourth gas channel, and the fourth gas channel is in communication with a pump configured for removing gas from the second gas channel, the wide-bore insulating tube, and the remote plasma source.

Further, the narrow-bore insulating tube is made of a ceramic material or a polytetrafluoroethylene material, or is a hard anodized aluminum part; and the wide-bore insulating tube is made of a ceramic material or a polytetrafluoroethylene material, or is hard anodized aluminum part.

Further, the cleaning gas is at least one selected from the group consisting of nitrogen trifluoride, argon, and nitrogen.

Further, the first gas channel and the second gas channel are made of aluminum.

A method for vacuum deposition using a plasma processing apparatus with the above-described structure is also provided in the present disclosure. In the method, before the deposition, the on-off valve is closed, and the cleaning gas is fed into the second gas channel until reaching a preset pressure; and then, the process gas is fed into the processing chamber through the narrow-bore insulating tube, the first gas channel, and the gas distribution assembly to carry out the vacuum deposition.

Further, the method includes the following steps of:

step 1, closing the on-off valve before the deposition, and then feeding the cleaning gas into the second gas channel until the preset pressure is reached;

step 2, feeding the process gas into the processing chamber through the narrow-bore insulating tube, the first gas channel, and the gas distribution assembly to start the vacuum deposition;

step 3, terminating the feeding of the process gas when the processing chamber is required to be cleaned, and then removing the cleaning gas from the second gas channel; and step 4, opening the on-off valve, and then feeding the cleaning gas into the processing chamber through the remote plasma source, the wide-bore insulating tube, the second gas channel, the first gas channel, and the gas distribution assembly to clean the processing chamber.

Further, the preset pressure is ranged from 1 Torr to 500 Torr.

3. Beneficial Effects

Compared with prior art, the embodiments provided in the present disclosure have the following beneficial effects.

1) In the present disclosure, the structure configured for solving parasitic plasma includes a first gas channel in communication with a gas distribution assembly, and a radio-frequency power source electronically connected to the first gas channel. The first gas channel is in communication with a narrow-bore insulating tube and a second gas channel. The narrow-bore insulating tube is configured to feed a process gas for plasma processing into the gas distribution assembly. An on-off valve is disposed between the first gas channel and the second gas channel. The second gas channel is configured to feed a cleaning gas into the gas distribution assembly. Therefore, on the one hand, the on-off valve can be closed before the deposition, and the cleaning gas with a preset pressure can be fed into the wide-bore insulating tube and the second gas channel, thereby forming a relative high-pressure environment in the wide-bore insulating tube and the second gas channel, thus reducing the possibility of breakdown of the cleaning gas by the high-voltage current. On the other hand, the gas paths of the process gas and the cleaning gas are separate from each other, so that the path of the process gas can have a relatively small inner diameter, thus reducing the possibility of breakdown of the process gas in the narrow-bore insulating tube by the high-voltage current, so as to avoid electrolysis of the process gas and generation of parasitic plasma before the process gas entering into the processing chamber, which effectively reduces the probability of rupture or damage of the insulating tube caused by the parasitic plasma.

2) In the present disclosure, one end of the second gas channel is in communication with the first gas channel through the on-off valve, and the other end of the second gas channel is in communication with the remote plasma source through the wide-bore insulating tube. The inner diameter of the wide-bore insulating tube is larger than that of the narrow-bore insulating tube, which facilitates a sufficient amount of the cleaning gas to be stably fed into the processing chamber to complete the cleaning.

3) In the method for vacuum deposition provided in the present disclosure, before the deposition, the cleaning gas is fed into the second gas channel, increasing the pressure in the second gas channel to a preset value. By increasing the pressure in this way, even on the condition that the inner diameter of the wide-bore insulating tube, the electric current breakdown can be prevented, so as to avoid electrolysis of the gas in the wide-bore insulating tube and prevent generation of parasitic plasma in the wide-bore insulating tube.

DETAILED DESCRIPTION

In order to further understand the content of the present disclosure, the present disclosure will be described in detail in combination with the accompany drawings and embodiments.

The structures, proportions, sizes, etc. shown in the accompany drawings are only for assisting in understanding and reading the contents disclosed in the specification, not intended to limit the conditions under which the present disclosure can be implemented, and thus have no technical significance. Any modifications to the structures, changes in proportional relationships, or adjustments to sizes, without affecting the effects or purposes to be achieved, all fall within the scope that the technical content disclosed by the present disclosure can cover. Meanwhile, the terms such as "up", "down", "left", "right", "middle" and so on recited in the specification are only for clarity in description and do not limit the scope of implementation. Changes or adjustments in the relative relationships without substantial changing the technical content shall also be considered within the scope of implementation of the present disclosure.

Figure 1:
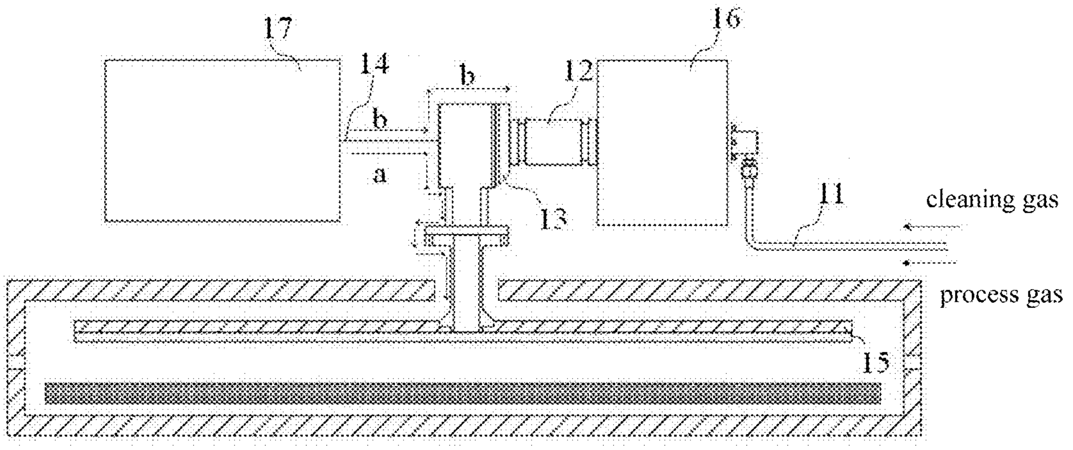
FIG. 1 Prior Art
FIG. 1 is a schematic structural view of a commonly used plasma processing apparatus.

The structure of a commonly used plasma processing apparatus for vacuum deposition is shown in FIG. 1. Specifically, the plasma processing apparatus includes a processing chamber configured for receiving a workpiece to be processed. A gas distribution assembly 15 is disposed in the processing chamber. The gas distribution assembly 15 is configured for distributing a process gas into the processing chamber. The gas distribution assembly 15 is in communication with a first gas channel 13. The first gas channel 13 is in communication a remote plasma source 16 through a wide-bore insulating tube 12. The remote plasma source 16 is in communication with a process gas source through a specialty gases pipeline 11. The process gas is fed into the gas distribution assembly 15 through the specialty gases pipeline 11, the remote plasma source 16, the wide-bore insulating tube 12, and the first gas channel 13, and is distributed in the processing chamber through the gas distribution assembly 15. In addition, the first gas channel 13 is electrically connected to a radio-frequency power source 17, for example, through a conducting sheet 14. An electric current is introduced along path a as shown in FIG. 1, from the radio-frequency power source 17 through the first gas channel 13 and the gas distribution assembly 15, so as to cause electrolysis of the process gas in the processing chamber, thereby completing the vacuum deposition.

When to clean the processing chamber, feeding of the process gas is terminated, and then a cleaning gas is fed into the gas distribution assembly 15 through the specialty gases pipeline 11, the remote plasma source 16, the wide-bore insulating tube 12, and the first gas channel 13. The cleaning gas is then distributed into the processing chamber through the gas distribution assembly 15 to complete the cleaning.

Since a large amount of the cleaning gas is required in cleaning of the processing chamber, in order to ensure that a sufficient amount of the cleaning gas can be stably fed into the gas distribution assembly 15, the inner diameter of the wide-bore insulating tube 12 is relatively large. However, the vacuum deposition usually requires a small amount of the process gas, and thus the gas pressure in the wide-bore insulating tube 12 is relatively low, which means that the process gas is in a state of "low cross-sectional pressure" when flowing through the wide-bore insulating tube 12. When the electric current reaches the wide-bore insulating tube 12 along path b as shown in FIG. 1, it may cause breakdown and discharge of the process gas, resulting in electrolysis of the process gas and generation of plasma in the wide-bore insulating tube 12. The plasma generated within the wide-bore insulating tube 12 is referred to as "parasitic plasma" in the present embodiment. When parasitic plasma is generated within the wide-bore insulating tube 12, the temperature of the wide-bore insulating tube 12 will be increased rapidly, which can cause rupture and damage of the wide-bore insulating tube 12, reducing the service life of the wide-bore insulating tube 12 and posing significant safety risks.

Figure 2:
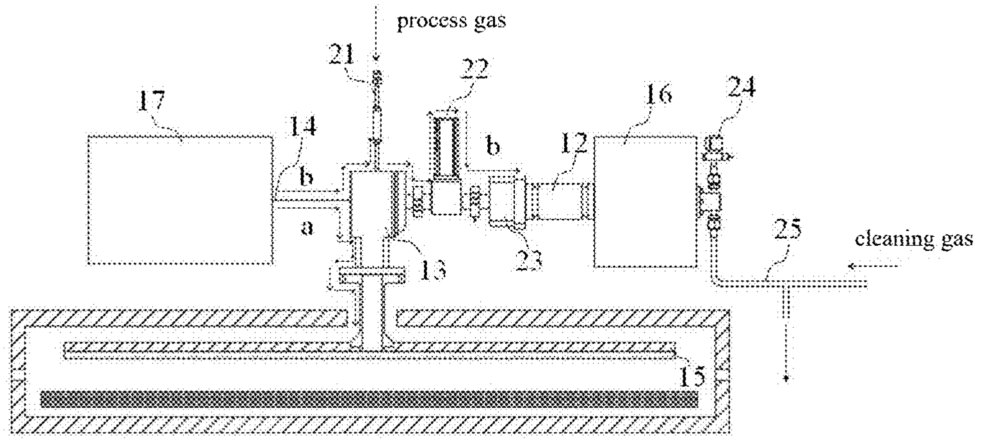
FIG. 2 is a schematic structural view of a plasma processing apparatus of the present disclosure.

In order to solve the above problems, referring to FIG. 2, the present embodiment provides a structure for resolving parasitic plasma. Specifically, the structure includes a first gas channel 13, a second gas channel 23, and a narrow-bore insulating tube 21. The first gas channel 13 is in communication with a gas distribution assembly 15 disposed in a processing chamber. The second gas channel 23 and the narrow-bore insulating tube 21 respectively are in communication with the first gas channel 13. The second gas channel 23 and the narrow-bore insulating tube 21 are respectively configured to be the path for feeding the cleaning gas and the path for feeding the process gas. An on-off valve 22 is disposed between the second gas channel 23 and the first gas channel 13.

Therefore, during the vacuum deposition, the on-off valve 22 can be used to disconnect the second gas channel 23 from the first gas channel 13, and the process gas can be fed into the gas distribution assembly 15 through the narrow-bore insulating tube 21 and the first gas channel 13. In cleaning of the processing chamber, the process gas source can be disconnected to terminate the gas supply, and the on-off valve 22 can be used to establish a communication between the second gas channel 23 and the first gas channel 13, allowing the cleaning gas to be fed into the gas distribution assembly 15 through the second gas channel 23 and the first gas channel 13. The first gas channel 13 and the second gas channel 23 can be made of electrically conducting materials, such as metal materials, e.g., aluminum.

The cleaning gas can be nitrogen trifluoride, argon, nitrogen, or other inert gases such as helium or neon. In addition, the cleaning gas can also be a mixture of at least two of nitrogen trifluoride, argon, nitrogen, etc., and the proportion of each gas in the cleaning gas mixture is not limited.

It can be appreciated by those of ordinary skill in the art that the smaller the diameter of the tube for introducing gas, the greater the electrical resistance of the gas, and the more difficult the breakdown and discharge of the gas; the greater the gas pressure in the tube, the greater the electrical resistance of the gas, and the more difficult the breakdown and discharge of the gas. Therefore, in the present embodiment, the gas paths of the cleaning gas and the process gas are separate from each other, so that the inner diameter of the narrow-bore insulating tube 21 can be reduced, preventing breakdown and discharge of the process gas in the narrow-bore insulating tube 21 and avoiding the generation of parasitic plasma while not affecting the sufficient and stable feeding of the cleaning gas.

As a further embodiment, one end of the second gas channel 23 can be in communication with the first gas channel 13 through the on-off valve 22, and the other end of the second gas channel 23 can be in communication with the remote plasma source 16 through the wide-bore insulating tube 12. The inner diameter of the wide-bore insulating tube 12 is greater than that of the narrow-bore insulating tube 21. Therefore, before the vacuum deposition, the on-off valve 22 can be used to disconnect the first gas channel 13 from the second gas channel 23, and the cleaning gas can be fed into the second gas channel 23 and the wide-bore insulating tube 12 until the pressure in the wide-bore insulating tube 12 reaches a preset value, so as to prevent the cleaning gas from breakdown and discharge, and avoid generation of parasitic plasma in the wide-bore insulating tube 12, thereby preventing rupture or damage of the wide-bore insulating tube 12.

As a further embodiment, the remote plasma source 16 can be in communication with a cleaning gas source through a third gas channel 25. A vacuum gauge 24 can be installed on the third gas channel 25. Before the vacuum deposition, during the feeding of the cleaning gas into the second gas channel 23 and the wide-bore insulating tube 12, the pressure of the cleaning gas in the third gas channel 25 can be measured by the vacuum gauge 24, which is located away from the processing chamber.

Moreover, a fourth gas channel can be in communication with the third gas channel 25. The fourth gas channel is in communication with a pump. Before the cleaning of the processing chamber, the gas in the second gas channel 23, the wide-bore insulating tube 12, and the remote plasma source 16 can be removed through the fourth gas channel. When the gas pressure in the second gas channel 23, the wide-bore insulating tube 12, and the remote plasma source 16 is reduced to a relatively low value, the on-off valve 22 can be opened to feed the cleaning gas into the gas distribution assembly 15. In this way, when the on-off valve 22 is opened, the high-pressure cleaning gas in the second gas channel 23 can be prevented from rushing into the processing chamber to cause damage to the plasma processing apparatus and the workpiece to be processed.

In the present embodiment, the narrow-bore insulating tube 21 can be made of a ceramic material or a polytetrafluoroethylene material, or is a hard anodized aluminum part; the wide-bore insulating tube 12 can be made of a ceramic material or a polytetrafluoroethylene material, or is a hard anodized aluminum part. In addition, the narrow-bore insulating tube 21 and the wide-bore insulating tube 12 can also be made of other insulating materials with equal performance. Moreover, the inner diameter of the narrow-bore insulating tube is 2 mm to 30 mm, and the inner diameter of the wide-bore insulating tube is 10 mm to 100 mm.

Furthermore, an embodiment of the present disclosure provides a method for vacuum deposition using the plasma processing apparatus with the above-described structure. Specifically, before the vacuum deposition, the on-off valve 22 is closed, and then the cleaning gas is fed into the second gas channel 23 until the pressure of the cleaning gas in the second gas channel 23 reaches a preset value. After that, the process gas is fed into the processing chamber through the narrow-bore insulating tube 21, the first gas channel 13, and the gas distribution assembly 15 to carry out the vacuum deposition.

Specifically, in the present embodiment, the method includes the following steps.

Step 1, before the deposition, the on-off valve is closed and the cleaning gas is fed into the second gas channel 23 until a preset pressure is reached. The cleaning gas is fed into the second gas channel 23 before the deposition to increase the pressure in the wide-bore insulating tube 12, preventing breakdown and discharge of the cleaning gas in the narrow-bore insulating tube 21 and avoiding generation of parasitic plasma in the narrow-bore insulating tube 21.

Step 2, the process gas is fed into the processing chamber through the narrow-bore insulating tube 21, the first gas channel 13, and the gas distribution assembly 15 to start vacuum deposition. In the present embodiment, the process gas and the cleaning gas are fed into the gas distribution assembly 15 through different gas paths, so that the inner diameter of the gas path of the process gas can be different from that of the gas path of the cleaning gas. The inner diameter of the gas path of the process gas can be reduced, preventing breakdown and discharge of the process gas in the narrow-bore insulating tube 21 and avoiding generation of parasitic plasma in the narrow-bore insulating tube 21.

Step 3, the feeding of the process gas is terminated when the processing chamber is required to be cleaned, and then the cleaning gas filled in the second gas channel 23 is removed. When the gas pressure in the second gas channel 23, the wide-bore insulating tube 12, and the remote plasma source 16 is reduced to a relatively low value, the on-off valve 22 is opened to introduce the cleaning gas into the gas distribution assembly 15. In this way, the high-pressure cleaning gas in the second gas channel 23 can be prevented from rushing into the processing chamber to cause damage to the plasma processing apparatus and the workpiece to be processed when the on-off valve 22 is opened.

Step 4, the on-off valve 22 is opened, and the cleaning gas is fed into the processing chamber through the remote plasma source 16, the wide-bore insulating tube 12, the second gas channel 23, the first gas channel 13, and the gas distribution assembly 15 to clean the processing chamber.

In step 3, the cleaning gas filled in the second gas channel 23 can be removed in the following method. The cleaning gas in the second gas channel 23 is removed through a vacuum pump in communication with the third gas channel 25, so that the pressure difference between the two sides of the on-off valve 22 is in a certain range, that is, the difference between the pressure in the second gas channel 23, the wide-bore insulating tube 12, and the remote plasma source 16 and the pressure in the processing chamber on the other side of the on-off valve 22 is in a certain range. Then, the off-valve 22 is opened, and the cleaning gas is fed into the gas distribution assembly 15 to clean the processing chamber.

As a further embodiment, in order to prevent breakdown and discharge of the cleaning gas in the wide-bore insulating tube 12 during the deposition, the preset pressure value in step 1 is ranged from 1 Torr to 500 Torr.

The above illustrated description of the present disclosure and its embodiments are not restrictive, and the accompany drawings only show some embodiments of the present disclosure, and the actual structure is not limited thereto. Therefore, in view of the inspiration of the present disclosure without departing from the purpose of the present disclosure, structures and embodiments similar to the technical solutions, designed by those of ordinary skill in the art without creative work, all fall within the protection scope of the present disclosure.

What is claimed is:

1. A structure for solving parasitic plasma in a plasma processing apparatus, comprising:

a first gas channel in communication with a gas distribution assembly;

a radio-frequency power source electronically connected to the first gas channel;

a narrow-bore insulating tube and a second gas channel both in communication with the first gas channel, the narrow-bore insulating tube being configured to feed a process gas for plasma processing into the gas distribution assembly;

an on-off valve disposed between the first gas channel and the second gas channel;

a remote plasma source and a wide-bore insulating tube, wherein one end of the second gas channel is in communication with the first gas channel through the on-off valve, another end of the second gas channel is in communication with the remote plasma source through the wide-bore insulating tube, and the inner diameter of the wide-bore insulating tube is larger than the inner diameter of the narrow-bore insulating tube;

a third gas channel, wherein the remote plasma source is in communication with a cleaning gas source through the third gas channel; and a fourth gas channel, wherein the third gas channel is in communication with the fourth gas channel, the fourth gas channel is in communication with a pump configured for removing gas from the second gas channel, the wide-bore insulating tube, and the remote plasma source;

wherein the second gas channel is configured to feed a cleaning gas into the gas distribution assembly.

2. The structure according to claim 1, wherein the narrow-bore insulating tube is made of a ceramic material or a polytetrafluoroethylene material, or is a hard anodized aluminum part; and the wide-bore insulating tube is made of a ceramic material or a polytetrafluoroethylene material, or is a hard anodized aluminum part.

3. The structure according to claim 1, wherein the cleaning gas is at least one selected from the group consisting of $NF_3$, $CF_4$, $SF_6$, $C_2F_6$, $F_2$, $Cl_2$, Ar, $H_2$, $N_2$, $CO_2$, $O_2$, $CCl_4$, $C_2Cl_6$, $C_3F_8$, and a combination thereof.

4. The structure according to claim 1, wherein the first gas channel and the second gas channel are made of aluminum.

5. The structure according to claim 1, wherein the inner diameter of the narrow-bore insulating tube is in a range from 2 mm to 30 mm; and the inner diameter of the wide-bore insulating tube is in a range from 10 mm to 100 mm.

6. The structure according to claim 1, the third gas channel is provided with a vacuum gauge, the vacuum gauge is configured to measure the pressure of the cleaning gas in the third gas channel.

7. A plasma processing apparatus, comprising the structure according to claim 1, the gas distribution assembly, and a processing chamber, wherein the gas distribution assembly is disposed in the processing chamber.

8. A method for vacuum deposition using a plasma processing apparatus with the structure according to claim 1, comprising: before the deposition, closing the on-off valve and feeding the cleaning gas into the wide-bore insulating tube and the second gas channel until a preset pressure is reached; and feeding the process gas into a processing chamber through the narrow-bore insulating tube, the first gas channel, and the gas distribution assembly to carry out the vacuum deposition.

9. The method according to claim 8, comprising following steps of:

step 1, closing the on-off valve before the deposition, and then feeding the cleaning gas into the wide-bore insulating tube and the second gas channel until the preset pressure is reached;

step 2, feeding the process gas into the processing chamber through the narrow-bore insulating tube, the first gas channel, and the gas distribution assembly to start the vacuum deposition;

step 3, terminating the feeding of the process gas when the processing chamber is required to be cleaned, and then removing the cleaning gas from the wide-bore insulating tube and the second gas channel; and step 4, opening the on-off valve, and then feeding the cleaning gas into the processing chamber through the remote plasma source, the wide-bore insulating tube, the second gas channel, the first gas channel, and the gas distribution assembly to clean the processing chamber.

10. The method of claim 8, wherein the preset pressure is ranged from 1 Torr to 500 Torr.

* * * * *